United States Patent
Sankman et al.

(10) Patent No.: US 9,646,851 B2
(45) Date of Patent: *May 9, 2017

(54) EMBEDDED SEMICONDUCTIVE CHIPS IN RECONSTITUTED WAFERS, AND SYSTEMS CONTAINING SAME

(71) Applicant: Intel Corporation, Santa Clara, CA (US)

(72) Inventors: Robert L. Sankman, Phoenix, AZ (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/070,968

(22) Filed: Mar. 15, 2016

(65) Prior Publication Data

US 2016/0196988 A1    Jul. 7, 2016

Related U.S. Application Data

(63) Continuation of application No. 14/614,687, filed on Feb. 5, 2015, which is a continuation of application (Continued)

(51) Int. Cl.
*H01L 21/48* (2006.01)
*H01L 21/683* (2006.01)
(Continued)

(52) U.S. Cl.
CPC .... *H01L 21/4853* (2013.01); *H01L 21/31053* (2013.01); *H01L 21/50* (2013.01);
(Continued)

(58) Field of Classification Search
None
See application file for complete search history.

(56) References Cited

U.S. PATENT DOCUMENTS 4,921,160 A    5/1990 Flynn et al.
5,353,498 A    10/1994 Fillion et al.
(Continued)

FOREIGN PATENT DOCUMENTS

CN    101404267 A    4/2009
CN    101952959 A    1/2011
(Continued)

OTHER PUBLICATIONS

Office Action received for Taiwan Patent Application No. 101119764, mailed on Dec. 20, 2012, 2 pages of Office Action only.
(Continued)

*Primary Examiner* — Shaun Campbell
*Assistant Examiner* — Aaron Dehne
(74) *Attorney, Agent, or Firm* — Winkle, PLLC

(57) ABSTRACT

A reconstituted wafer includes a rigid mass with a flat surface and a base surface disposed parallel planar to the flat surface. A plurality of dice are embedded in the rigid mass. The plurality of dice include terminals that are exposed through coplanar with the flat surface. A process of forming the reconstituted wafer includes removing some of the rigid mass to expose the terminals, while retaining the plurality of dice in the rigid mass. A process of forming an apparatus includes separating one apparatus from the reconstituted wafer.

14 Claims, 8 Drawing Sheets

Related U.S. Application Data

No. 13/966,806, filed on Aug. 14, 2013, now Pat. No. 8,969,140, which is a continuation of application No. 12/753,637, filed on Apr. 2, 2010, now Pat. No. 8,535,989.

(51) Int. Cl.

| | | |
|---|---|---|
| *H01L 23/538* | (2006.01) | |
| *H01L 23/64* | (2006.01) | |
| *H01L 25/16* | (2006.01) | |
| *H01L 21/50* | (2006.01) | |
| *H01L 23/522* | (2006.01) | |
| *H01L 21/3105* | (2006.01) | |
| *H01L 21/56* | (2006.01) | |
| *H01L 23/31* | (2006.01) | |
| *H01L 25/065* | (2006.01) | |
| *H01L 25/00* | (2006.01) | |
| *H01L 21/78* | (2006.01) | |
| *H01L 23/00* | (2006.01) | |

(52) U.S. Cl.
CPC ........... *H01L 21/56* (2013.01); *H01L 21/565* (2013.01); *H01L 21/6835* (2013.01); *H01L 21/78* (2013.01); *H01L 23/3107* (2013.01); *H01L 23/522* (2013.01); *H01L 23/5389* (2013.01); *H01L 23/64* (2013.01); *H01L 24/19* (2013.01); *H01L 24/96* (2013.01); *H01L 24/97* (2013.01); *H01L 25/0655* (2013.01); *H01L 25/16* (2013.01); *H01L 25/50* (2013.01); *H01L 21/568* (2013.01); *H01L 24/16* (2013.01); *H01L 24/48* (2013.01); *H01L 2221/68345* (2013.01); *H01L 2224/04105* (2013.01); *H01L 2224/16225* (2013.01); *H01L 2224/48091* (2013.01); *H01L 2224/48227* (2013.01); *H01L 2224/97* (2013.01); *H01L 2924/00014* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01078* (2013.01); *H01L 2924/14* (2013.01); *H01L 2924/15174* (2013.01); *H01L 2924/181* (2013.01); *H01L 2924/19041* (2013.01); *H01L 2924/19105* (2013.01); *H01L 2924/3025* (2013.01)

(56) References Cited

U.S. PATENT DOCUMENTS

| | | | |
|---|---|---|---|
| 5,497,033 A | 3/1996 | Fillion et al. | |
| 5,510,649 A | 4/1996 | Adhihetty et al. | |
| 5,527,741 A | 6/1996 | Cole et al. | |
| 5,841,193 A | 11/1998 | Eichelberger | |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,472,762 B1 | 10/2002 | Kutlu | |
| 6,489,185 B1 | 12/2002 | Towle et al. | |
| 6,507,122 B2 | 1/2003 | Blackshear | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,109,055 B2 | 9/2006 | McDonald et al. | |
| 7,112,467 B2 | 9/2006 | Eichelberger et al. | |
| 7,144,756 B1 | 12/2006 | Wang et al. | |
| 7,160,755 B2 | 1/2007 | Lo et al. | |
| 7,183,658 B2 | 2/2007 | Towle et al. | |
| 7,189,596 B1 | 3/2007 | Mu et al. | |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,459,782 B1 | 12/2008 | Li | |
| 7,476,563 B2 | 1/2009 | Mangrum et al. | |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,633,143 B1 | 12/2009 | Fan | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 7,723,164 B2 | 5/2010 | Lu et al. | |
| 7,851,905 B2 | 12/2010 | Chrysler et al. | |
| 8,035,216 B2 | 10/2011 | Skeete | |
| 8,093,704 B2 | 1/2012 | Palmer et al. | |
| 8,105,934 B2 | 1/2012 | Kwon et al. | |
| 8,264,849 B2 | 9/2012 | Guzek | |
| 8,304,913 B2 | 11/2012 | Nalla et al. | |
| 8,319,318 B2 | 11/2012 | Nalla et al. | |
| 8,497,587 B2 | 7/2013 | Ma | |
| 8,535,989 B2 * | 9/2013 | Sankman ............ H01L 21/6835 257/678 |
| 8,848,380 B2 | 9/2014 | Malatkar et al. | |
| 8,937,382 B2 | 1/2015 | Teh et al. | |
| 8,969,140 B2 | 3/2015 | Sankman et al. | |
| 9,257,368 B2 | 2/2016 | Goh et al. | |
| 2001/0002051 A1 | 5/2001 | Matsumoto et al. | |
| 2001/0010397 A1 | 8/2001 | Masuda et al. | |
| 2001/0015492 A1 | 8/2001 | Akram et al. | |
| 2002/0063342 A1 | 5/2002 | Blackshear | |
| 2002/0088116 A1 | 7/2002 | Milkovich et al. | |
| 2002/0145204 A1 | 10/2002 | Naka et al. | |
| 2003/0207495 A1 | 11/2003 | Akram et al. | |
| 2004/0262776 A1 | 12/2004 | Lebonheur et al. | |
| 2005/0062173 A1 | 3/2005 | Vu et al. | |
| 2005/0087356 A1 | 4/2005 | Forcier et al. | |
| 2005/0112798 A1 | 5/2005 | Bjorbell et al. | |
| 2006/0091560 A1 | 5/2006 | Kang et al. | |
| 2006/0145328 A1 | 7/2006 | Hsu et al. | |
| 2006/0151865 A1 | 7/2006 | Han et al. | |
| 2006/0186524 A1 | 8/2006 | Aiba et al. | |
| 2006/0186536 A1 | 8/2006 | Hsu | |
| 2007/0108625 A1 | 5/2007 | Hsu | |
| 2007/0279885 A1 | 12/2007 | Basavanhally et al. | |
| 2008/0029895 A1 | 2/2008 | Hu et al. | |
| 2008/0128916 A1 | 6/2008 | Soejima et al. | |
| 2008/0182363 A1 | 7/2008 | Amrine et al. | |
| 2008/0308917 A1 | 12/2008 | Pressel et al. | |
| 2008/0315377 A1 | 12/2008 | Eichelberger et al. | |
| 2008/0315391 A1 | 12/2008 | Kohl et al. | |

(56) References Cited

U.S. PATENT DOCUMENTS

| | | |
|---|---|---|
| 2008/0315398 A1 | 12/2008 | Lo et al. |
| 2009/0072382 A1 | 3/2009 | Guzek |
| 2009/0075428 A1 | 3/2009 | Tang et al. |
| 2009/0079064 A1 | 3/2009 | Tang et al. |
| 2009/0121347 A1 | 5/2009 | Kasai et al. |
| 2009/0152743 A1 | 6/2009 | Jomaa et al. |
| 2009/0212416 A1 | 8/2009 | Skeete |
| 2009/0236031 A1 | 9/2009 | Sunohara et al. |
| 2010/0013101 A1 | 1/2010 | Hedler et al. |
| 2010/0032827 A1 | 2/2010 | Hsu |
| 2010/0044855 A1 | 2/2010 | Eichelberger et al. |
| 2010/0047970 A1 | 2/2010 | Eichelberger et al. |
| 2010/0073894 A1 | 3/2010 | Mortensen et al. |
| 2010/0127394 A1 | 5/2010 | Ramiah et al. |
| 2010/0216280 A1 | 8/2010 | Smeys et al. |
| 2010/0237481 A1 | 9/2010 | Chi et al. |
| 2011/0089546 A1 | 4/2011 | Bayan |
| 2011/0101491 A1 | 5/2011 | Skeete et al. |
| 2011/0108999 A1 | 5/2011 | Nalla et al. |
| 2011/0121449 A1* | 5/2011 | Lin ............... H01L 21/568 257/737 |
| 2011/0156231 A1 | 6/2011 | Guzek |
| 2011/0156235 A1 | 6/2011 | Yuan |
| 2011/0156261 A1 | 6/2011 | Kapusta et al. |
| 2011/0215464 A1 | 9/2011 | Guzek |
| 2011/0221069 A1* | 9/2011 | Kunimoto ......... H01L 23/5389 257/774 |
| 2011/0228464 A1 | 9/2011 | Guzek et al. |
| 2011/0241186 A1 | 10/2011 | Nalla et al. |
| 2011/0241195 A1 | 10/2011 | Nalla et al. |
| 2011/0241215 A1 | 10/2011 | Sankman et al. |
| 2011/0254124 A1 | 10/2011 | Nalla et al. |
| 2011/0272795 A1 | 11/2011 | Chang et al. |
| 2011/0281375 A1 | 11/2011 | Swaminathan et al. |
| 2011/0316140 A1 | 12/2011 | Nalla et al. |
| 2012/0001339 A1 | 1/2012 | Malatkar |
| 2012/0005887 A1 | 1/2012 | Mortensen et al. |
| 2012/0009738 A1 | 1/2012 | Crawford et al. |
| 2012/0049382 A1 | 3/2012 | Malatkar |
| 2012/0074580 A1 | 3/2012 | Nalla et al. |
| 2012/0074581 A1 | 3/2012 | Guzek et al. |
| 2012/0104583 A1 | 5/2012 | Lee et al. |
| 2012/0112336 A1 | 5/2012 | Guzek et al. |
| 2012/0139095 A1 | 6/2012 | Manusharow et al. |
| 2012/0139116 A1 | 6/2012 | Manusharow et al. |
| 2012/0220082 A1 | 8/2012 | Ng et al. |
| 2012/0286425 A1 | 11/2012 | Chan et al. |
| 2012/0326271 A1 | 12/2012 | Teh et al. |
| 2013/0003319 A1 | 1/2013 | Malatkar et al. |
| 2013/0203265 A1 | 8/2013 | Hsiao |
| 2013/0270719 A1 | 10/2013 | Malatkar et al. |
| 2013/0328207 A1 | 12/2013 | Sankman et al. |
| 2014/0021635 A1 | 1/2014 | Goh et al. |
| 2014/0048959 A1 | 2/2014 | Hu |
| 2014/0363929 A1 | 12/2014 | Malatkar et al. |
| 2015/0135526 A1 | 5/2015 | Teh et al. |
| 2015/0145138 A1 | 5/2015 | Sankman et al. |
| 2016/0118354 A1 | 4/2016 | Goh et al. |

FOREIGN PATENT DOCUMENTS

| | | | |
|---|---|---|---|
| JP | 2004-056093 A | | 2/2004 |
| JP | 2004-200201 A | | 7/2004 |
| JP | 2012-074536 A | | 4/2012 |
| KR | 1999-0007859 A | | 1/1999 |
| KR | 10-2010-0038232 A | | 4/2010 |
| KR | 10-2010-0105506 A | | 9/2010 |
| TW | 200509321 A | | 3/2005 |
| TW | 200903756 A | | 1/2009 |
| WO | 2006/010115 A2 | | 1/2006 |
| WO | 2006/101155 A1 | | 9/2006 |
| WO | 2013/003257 A2 | | 1/2013 |
| WO | 2013/003695 A2 | | 1/2013 |
| WO | 2013/003257 A3 | | 3/2013 |
| WO | 2013/003695 A3 | | 5/2013 |
| WO | 2013/172814 A1 | | 11/2013 |
| WO | 2013/184145 A1 | | 12/2013 |

OTHER PUBLICATIONS

Office Action received for Taiwan Patent Application No. 101119764, mailed on Mar. 24, 2014, 5 pages of English Translation and 6 pages of Taiwan Office Action.

Office Action received for Taiwan Patent Application No. 102115911, mailed on Feb. 26, 2015, 8 pages of English Translation and 10 pages of Taiwan Office Action.

Office Action received for Japanese Patent Application No. 2014-517243, mailed on Mar. 3, 2015, 5 pages of English Translation and 5 pages of Japanese Office Action.

Ma, Qing, "Direct Build-Up Layer on an Encapsulated Die Package", U.S. Appl. No. 09/640,961, filed Aug. 16, 2000, 70 pages.

International Preliminary Report on Patentability and Written Opinion received for PCT Patent Application No. PCT/US2012/037787, mailed on Nov. 27, 2014, 8 pages.

International Search Report and Written Opinion received for PCT Patent Application No. PCT/US2012/037787, mailed on Jul. 26, 2013, 11 pages.

International Preliminary Report on Patentability and Written Opinion received for PCT Patent Application No. PCT/US2012/041714, mailed on Dec. 18, 2014, 7 pages.

International Search Report and Written Opinion received for PCT Patent Application No. PCT/US2012/041714, mailed on Feb. 26, 2013, 10 pages.

International Preliminary Report on Patentability and Written Opinion received for PCT Patent Application No. PCT/US2012/043945, mailed on Jan. 16, 2014, 9 pages.

International Search Report and Written Opinion received for PCT Patent Application No. PCT/US2012/043945, mailed on Jan. 10, 2013, 12 pages.

International Preliminary Report on Patentability and Written Opinion received for PCT Patent Application No. PCT/US2012/044871, mailed on Jan. 16, 2014, 7 pages.

International Search Report and Written Opinion received for PCT Patent Application No. PCT/US2012/044871, mailed on Jan. 10, 2013, 10 pages.

Notice of Allowance received for Taiwanese Patent Application No. 101119764, mailed on Mar. 27, 2015, 2 pages of Notice of Allowance only.

Notice of Allowance received for Korean Patent Application No. 10-2013-7034216, mailed on Sep. 16, 2015, 2 pages of Notice of Allowance only.

Office Action received for Korean Patent Application No. 10-2013-7034216, mailed on Mar. 12, 2015, 4 pages of Office Action only.

Office Action Received for Taiwan Patent application No. 102115911, mailed on Dec. 8, 2015, 8 pages of English Translation and 9 pages of Taiwan Office Action.

Office Action received for United Kingdom Patent Application No. 1321492.9, mailed on Feb. 17, 2015, 4 Pages.

Office Action received for United Kingdom Patent Application No. 1321492.9, mailed on Jul. 27, 2015, 2 pages.

Office Action received for Chinese Patent Application No. 201280032156.7, mailed on Oct. 28, 2015, 6 pages of Office Action only.

Office Action received for Chinese Patent Application No. 201280032555.3, mailed on Oct. 27, 2015, 6 pages of Office Action only.

Office Action and Search Report received for Taiwan Patent Application No. 101120105, mailed on Apr. 13, 2016, 5 pages of Taiwan Office Action including 1 page of English Translation of Search Report.

Office Action received for German Patent Application No. 112012002654.3, mailed on Sep. 6, 2016, 12 pages of German Office Action only.

Office Action received for German Patent Application No. 112012006469.0, mailed on Aug. 5, 2016, 8 pages of German Office Action only.

(56) References Cited

OTHER PUBLICATIONS

Notice of Allowance received for Chinese Patent Application No. 201280032156.7, mailed on Jul. 25, 2016, 4 pages of Chinese Notice of Allowance including 2 pages of English Translation.

Office Action received for Chinese Patent Application No. 201280032156.7, mailed on May 19, 2016, 3 pages of Chinese Office Action only.

Notice of Allowance received for Chinese Patent Application No. 201280032555.3, mailed on Apr. 7, 2016, 4 pages of Chinese Notice of Allowance including 2 pages of English Translation.

Office Action received for Chinese Patent Application No. 201280073065.8, mailed on Aug. 1, 2016, 6 pages of Chinese Office Action only.

* cited by examiner

100
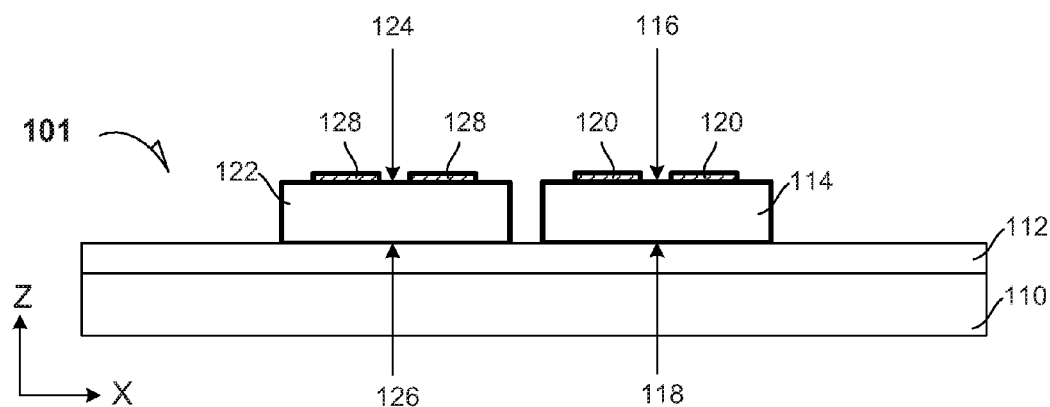
Fig. 1a
Fig. 1b
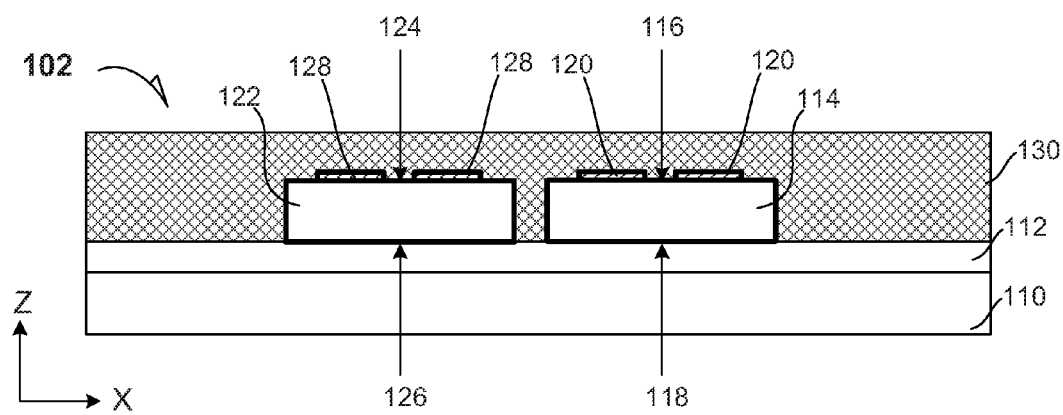
Fig. 1c

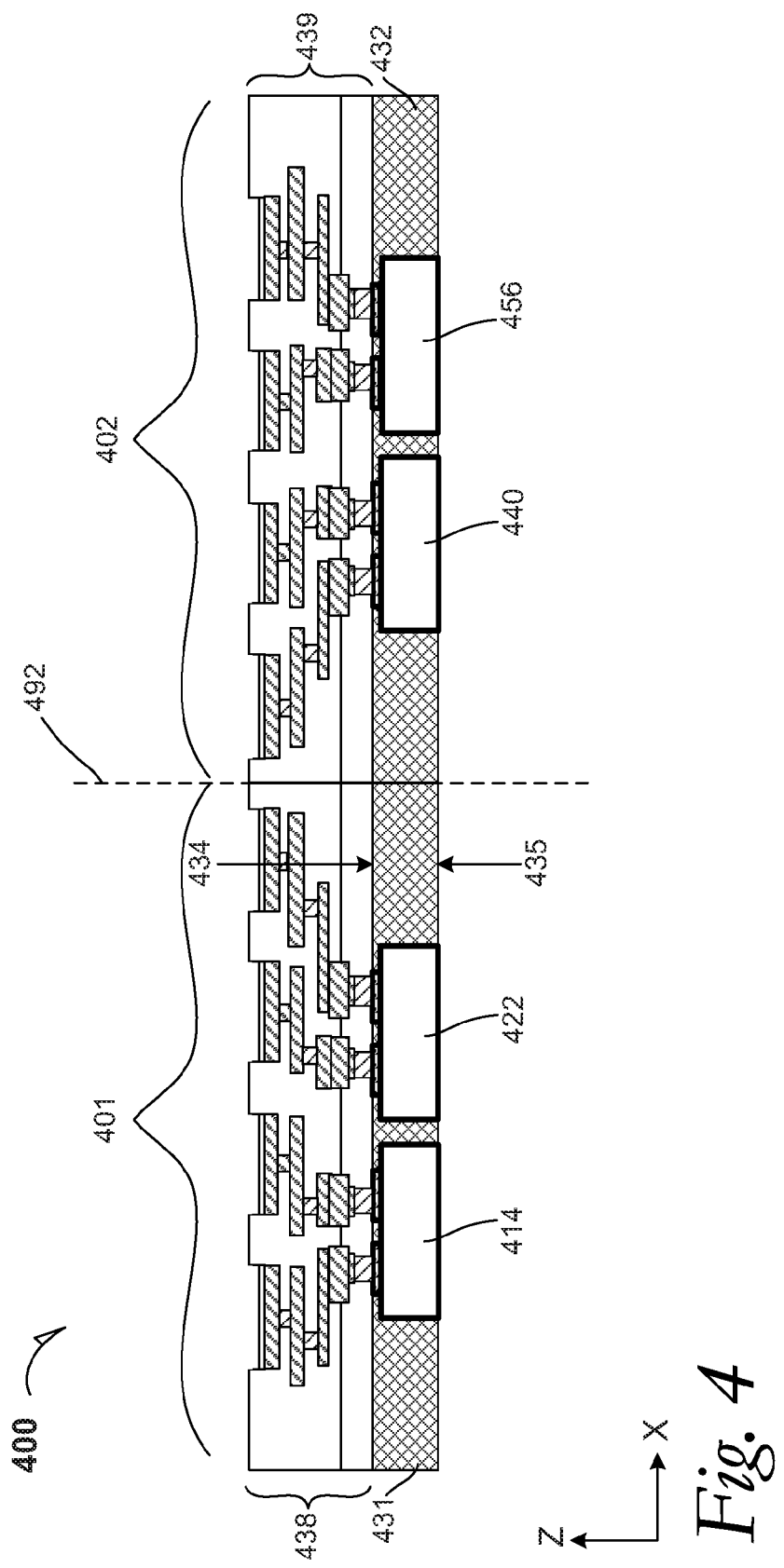

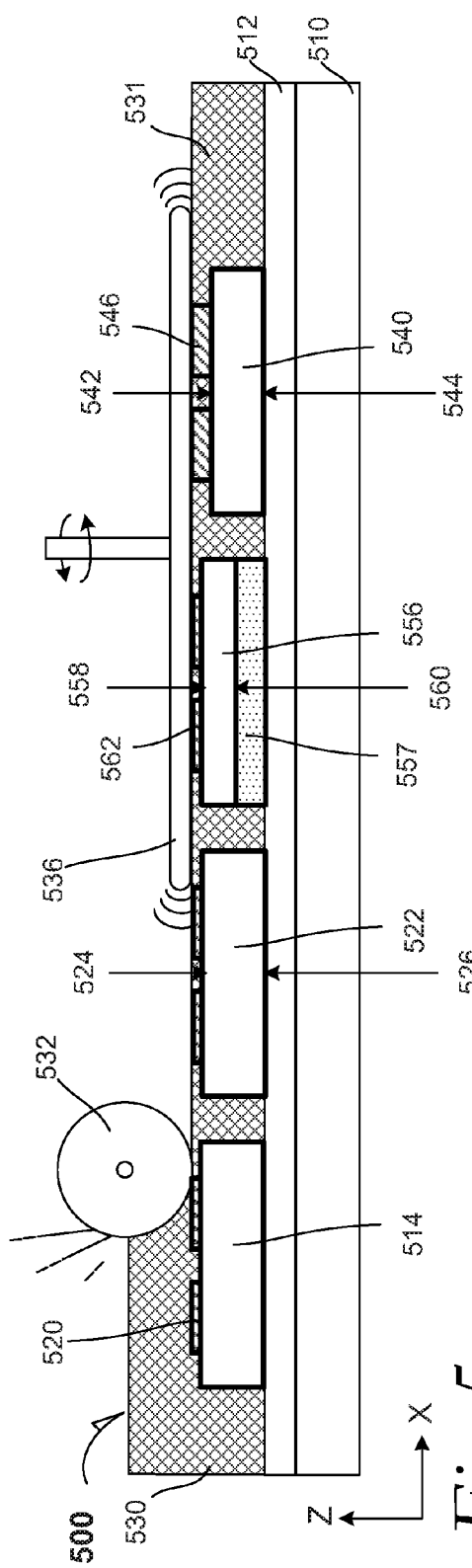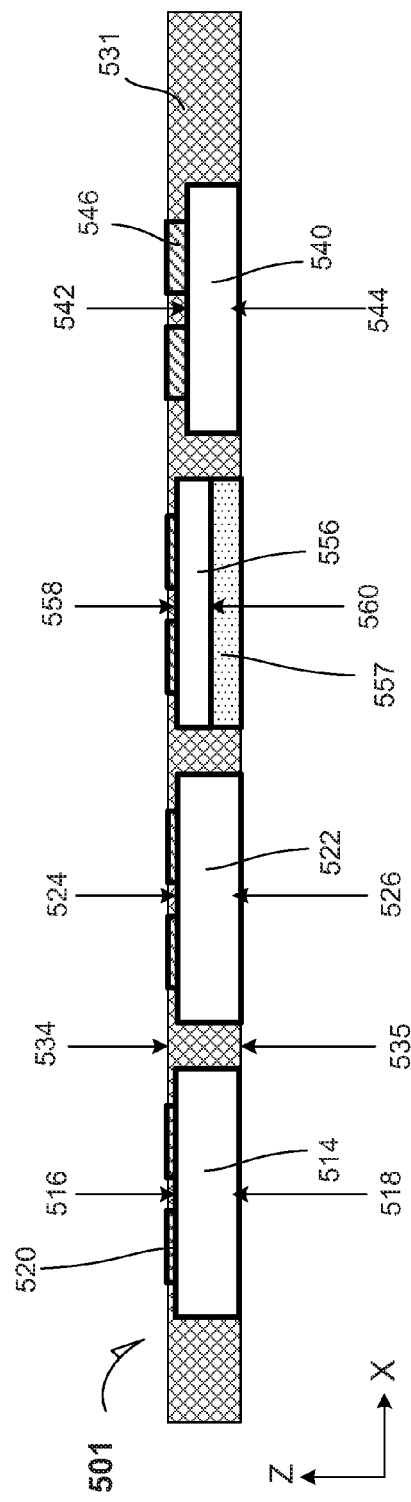

EMBEDDED SEMICONDUCTIVE CHIPS IN RECONSTITUTED WAFERS, AND SYSTEMS CONTAINING SAME

RELATED MATTERS

The present application is a continuation of U.S. patent application Ser. No. 14/614,687, filed Feb. 5, 2015, entitled "EMBEDDED SEMICONDUCTIVE CHIPS IN RECONSTITUTED WAFERS, AND SYSTEMS CONTAINING SAME", which is a continuation of U.S. patent application Ser. No. 13/966,806, filed on Aug. 14, 2013, entitled "EMBEDDED SEMICONDUCTIVE CHIPS IN RECONSTITUTED WAFERS, AND SYSTEMS CONTAINING SAME", patented as U.S. Pat. No. 8,969,140, issued on Mar. 3, 2015, which is a continuation of U.S. patent application Ser. No. 12/753,637, filed on Apr. 2, 2010, entitled "EMBEDDED SEMICONDUCTIVE CHIPS IN RECONSTITUTED WAFERS, AND SYSTEMS CONTAINING SAME", patented as U.S. Pat. No. 8,535,989, issued on Sep. 17, 2013, all of which are hereby incorporated herein by reference in their entirety and for all purposes.

Disclosed embodiments relate to embedded semiconductive chips in reconstituted wafers and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of a semiconductor device during processing according to an example embodiment;

FIG. 1b is a cross-section elevation of the semiconductor device depicted in FIG. 1a after further processing according to an embodiment;

FIG. 1c is a cross-section elevation of the semiconductor device depicted in FIG. 1b after further processing according to an embodiment;

FIG. 1e is a cross-section elevation of the semiconductor device depicted in FIG. 1c or.

FIG. 1d after further processing according to an embodiment;

FIG. 4 is a cross-section elevation of a plurality of reconstituted and joined apparatus during processing according to an example embodiment;

FIG. 5a is a cross-section elevation of an apparatus derived from a reconstituted wafer during processing according to an example embodiment;

FIG. 5b is a cross-section elevation of the apparatus depicted in FIG. 5a after further processing according to an example embodiment;

DETAILED DESCRIPTION

Figure 1D:
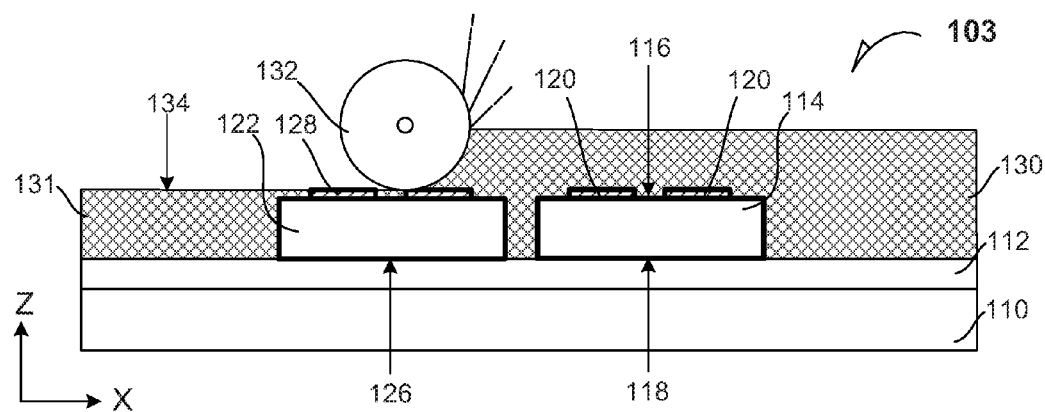
FIG. 1d is a cross-section elevation of the semiconductor device depicted in FIG. 1c after further processing according to an embodiment.

Processes are disclosed where reconstituted wafer embodiments are formed by embedding a plurality of dice into a rigid mass, followed by bumpless build-up layer processing to couple the reconstituted wafer to other devices and the outside world.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1a is a cross-section elevation of a semiconductor device 100 during processing according to an example embodiment. A backing plate 110 is provided with an adhesive 112 disposed thereupon. The backing plate 110 and adhesive 112 provide a temporary mounting substrate for a plurality of dice. In an embodiment, the backing plate 110 is made of a ceramic material. In an embodiment, the backing plate 110 is made of a glass material. In an embodiment, the backing plate 110 is made of a quartz material. The adhesive 112 may be formulated to have an ultraviolet release action. The adhesive 112 may be formulated to have a thermal release action.

FIG. 1b is a cross-section elevation of the semiconductor device depicted in FIG. 1a after further processing according to an embodiment. The semiconductor device 101 has been added upon with a first die 114 with an active surface 116 and a backside surface 118. The first die 114 also has electrical connections 120 such as raised copper posts 120. The semiconductor device 101 has also been added upon with a subsequent die 122 with an active surface 124 and a backside surface 126. The subsequent die 122 also has electrical connections 128 such as raised copper posts. The electrical connections 120 and 128 may be made by plating copper onto the dice.

In an embodiment, the first die 114 and the subsequent die 122 are identical dice such as a double-core processor device 101. In an embodiment, the first die 114 and the subsequent die 122 are dissimilar dice such as a processor 114 and a memory die 122. The electrical connections 120 and 128 may also be referred to as terminals 120 and 128. For illustrative clarity, the number of terminals may be much higher than the illustrated two each.

With respect to the first die 114, the terminals 120 are raised above the active surface 116 in a range from zero (flush therewith) to 100 micrometer (µm). In an embodiment, the terminals 120 are raised above the active surface 118 in a range from 0.5 µm to 40 µm. Similarly where the first die 114 and the subsequent die 122 have virtually identical form factors in the Z-direction, the terminals 128 are raised above the active surface 124 in a range from zero (flush therewith) to 100 micrometer (μm). In an embodiment, the terminals 128 are raised above the active surface 124 in a range from 0.5 μm to 40 μm. The first die 114 and the subsequent die 122 are mounted with active surfaces facing upward (Z direction) and are configured such that the raised posts (e.g. electrical connections 120 and 128) have about the same Z-height as depicted.

The backing plate 110 is of sufficient rigidity that the first die 114 and the subsequent die 122 remain in a useful lateral X-Y (the Y-direction is orthogonal to the plane of the FIG.) positional accuracy that allows for retention of original placement upon the adhesive 112. Consequently, during further processing, the lateral X-Y positional accuracy of the two dice 114 and 122 relative to each other is preserved. For example, where the first die 114 and the subsequent die 122 have identical function such that they are each Intel Atom® processors, where the first die 114 is about 8 mm by 4 mm (e.g. 7.94 mm by 3.27 mm), a sufficient X-Y positional accuracy is maintained for the electrical connections 120 and 128 to allow a useful process of forming multiple devices in a single rigid mass 131. The geometry of the dice 114 and 122 may be smaller than Atom® such as smaller than 15 nanometer (nm) silicon technologies.

In an example embodiment, the bond pads 120 and 128 have a width in the X-direction in a range from 10 μm to 60 μm, and movement of the dice 114 and 122 is constrained to below 0.5 μm in any given lateral direction. Other processes may be done such as semi-additive processing to form a wiring structure in place of the BBUL structure 138. In an embodiment, a damascene process is carried out to penetrate though a dielectric material to form the wiring structure.

FIG. 1c is a cross-section elevation of the semiconductor device depicted in FIG. 1b after further processing according to an embodiment. The semiconductor device 102 has been processed such that a rigid mass 130 has been formed to embed the first die 114 and the subsequent die 122 and to obscure the terminals 120 and 128. In an embodiment, the rigid mass 130 is an epoxy composition that cures and hardens to a degree that matches the lateral-motion rigidity of the backing plate 110. Consequent to forming the rigid mass 130, the plurality of dice 114 and 122 are entirely encapsulated therewithin. In an embodiment, the epoxy includes fillers such as particulates and fibers. Other materials may be used in place of the epoxy, including silicones, polyimides, epoxy-acrylates, and liquid crystal polymers.

FIG. 1d is a cross-section elevation of the semiconductor device depicted in FIG. 1c after further processing according to an embodiment. The semiconductor device 103 is depicted during processing to remove some of the rigid mass 130. In an embodiment, a grinding wheel 132 is being used to form a terminal-exposing rigid mass 131 from the rigid mass 130. The grinding wheel 132 is depicted exposing a terminal 128 of the subsequent die 122. Other methods may be used to expose the terminals 128.

In an embodiment, grinding to form the terminal-exposing rigid mass 131 is done with precision Z-directional control to stop on the electrical connections 120 and 128. After grinding, the terminals 120 and 128 are exposed through the flat surface 134 and they are also parallel planar to the flat surface 134. In an embodiment, grinding to form the terminal-exposing rigid mass 131 is done with precision Z-directional control to form a substantially flat exposed surface 134 such that both rigid mass material 130 and incidental amounts of electrical connection materials 120 and 128 are removed. The flat exposed surface 134 may also be referred to as a planar exposure 134. In an embodiment, grinding to form the terminal-exposing rigid mass 131 is done with precision Z-directional control and with a chemical assistant that is selective to removing the rigid mass 130, but not the electrical connections 120 and 128. In an embodiment, grinding to form the terminal-exposing rigid mass 131 is done with precision Z-directional control and with a chemical assistant that is selective to removing material from the electrical connections 120 and 128 but not the rigid mass 130. In any event, processing embodiments achieve the substantially flat exposed surface 134 such that BBUL processing that uses a 60 to 130 μm pin-out geometry is enabled in a single rigid mass 131. In an embodiment, the achieved flatness is less than 10 μm deviation across a width of 4 mm.

Figure 1E:
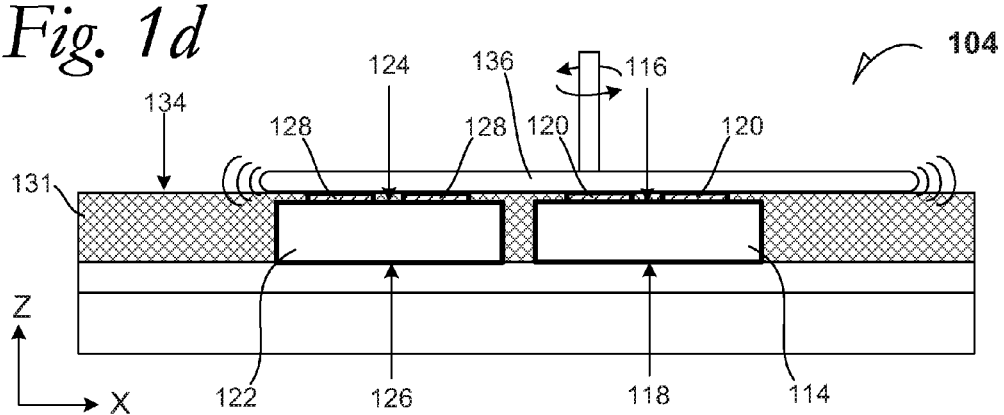

FIG. 1e is a cross-section elevation of the semiconductor device depicted in FIG. 1c or FIG. 1d after further processing according to an embodiment. The semiconductor device 104 is depicted during processing to for the terminal-exposing rigid mass 131. In an embodiment, a polishing pad 136 is being used to form the terminal-exposing rigid mass 131. The polishing pad 136 is depicted exposing the terminals 120 and 128.

In an embodiment, grinding as depicted generally in FIG. 1d is first done, followed by polishing as depicted generally in FIG. 1e. After polishing, the terminals 120 and 128 are exposed through the flat surface 134 and they are also parallel planar to the flat surface 134. In an embodiment, polishing with the polishing pad 136 to form the terminal-exposing rigid mass 131 from the rigid mass 130 is done with precision Z-directional control to stop on the electrical connections 120 and 128. In an embodiment, polishing to form the terminal-exposing rigid mass 131 is done with precision Z-directional control to form a substantially flat exposed surface 134 such that both rigid mass material 130 and incidental amounts of electrical connection materials 120 and 128 are removed. In an embodiment, polishing to form the terminal-exposing rigid mass 131 is done with precision Z-directional control and with a chemical assistant that is selective to removing the rigid mass 130, but not the electrical connections 120 and 128. In an embodiment, polishing to form the terminal-exposing rigid mass 131 is done with precision Z-directional control and with a chemical assistant that is selective to removing material from the electrical connections 120 and 128 but not the rigid mass 130. In any event, at least one of polishing with optional grinding embodiments achieves the substantially flat exposed surface 134 such that BBUL processing that uses a 60 to 130 μm pin-out geometry is enabled in a single rigid mass 131. In an embodiment, the achieved flatness is less than 10 μm deviation across a width of 4 mm.

In an embodiment, flatness of the flat exposed surface 134 is quantified as a deviation in either Z-direction of no more than 10 μm across a lateral (e.g. X-direction) distance of 8 mm. Before dicing of the structure 104 is accomplished to achieve individual apparatus, the structure 104 may be referred to as a "reconstituted wafer" 104.

Figure 1F:
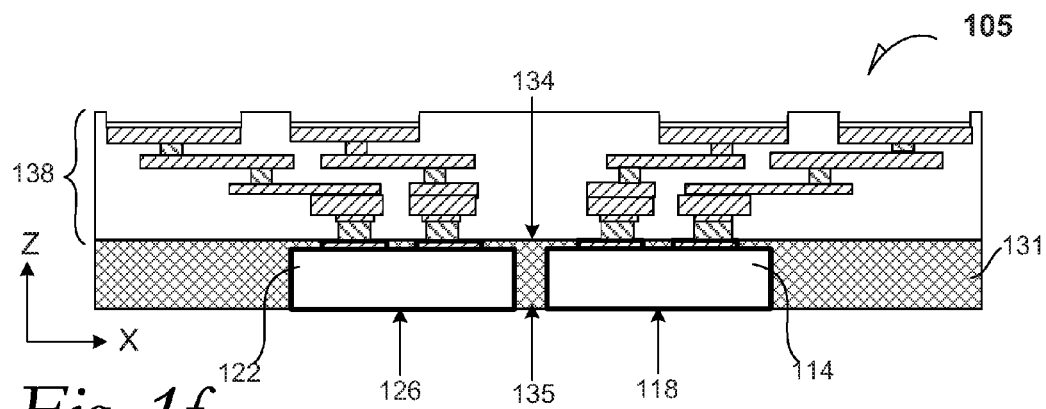
FIG. 1f is a cross-section elevation of the semiconductor device depicted in FIG. 1f after further processing according to an embodiment.

FIG. 1f is a cross-section elevation of the semiconductor device depicted in FIG. 1f after further processing according to an embodiment. The semiconductor device 105 has been processed to remove the backing plate 110 (seen in FIGS. 1a through 1e) and the adhesive 112. In an embodiment, the backing plate 110 is removed before processing depicted in FIG. 1d. In an embodiment, the backing plate 110 is removed before processing depicted in FIG. 1e. In an embodiment, the backing plate 110 is removed before processing depicted in FIG. 1f.

Removal of the backing plate 110 and the adhesive 112 exposes the backside surfaces 118 and 126 of the respective first- and subsequent dice 114 and 122. Removal of the backing plate 110 and the adhesive 112 also exposes a rigid mass base surface 135 that is disposed parallel planar to the flat surface 135.

After at least one of the grinding and polishing embodiments is completed, the semiconductive device 103 (FIG. 1*d*) or the semiconductive device 104 (FIG. 1*e*) may be referred to as derived from a reconstituted wafer. The semiconductive device 103 or 104 has the properties of a plurality of dice 114 and 122 fixed in a rigid mass 131 and sharing at least the flat exposed surface 134 with terminals 120 and 128 emerging therethrough. In an embodiment, the semiconductive device 103 or 104 also has the property of the backside surfaces 118 and 126 share a surface with the base surface 135.

After the flat exposed surface 134 has been formed, BBUL processing may be done to form a BBUL structure 138. The BBUL structure 138 is depicted in simplified form for illustrative clarity. In an embodiment, the BBUL structure 138 includes devices that work with the plurality of dice 116 and 122 to form a system in a package (SiP) apparatus.

Figure 2:
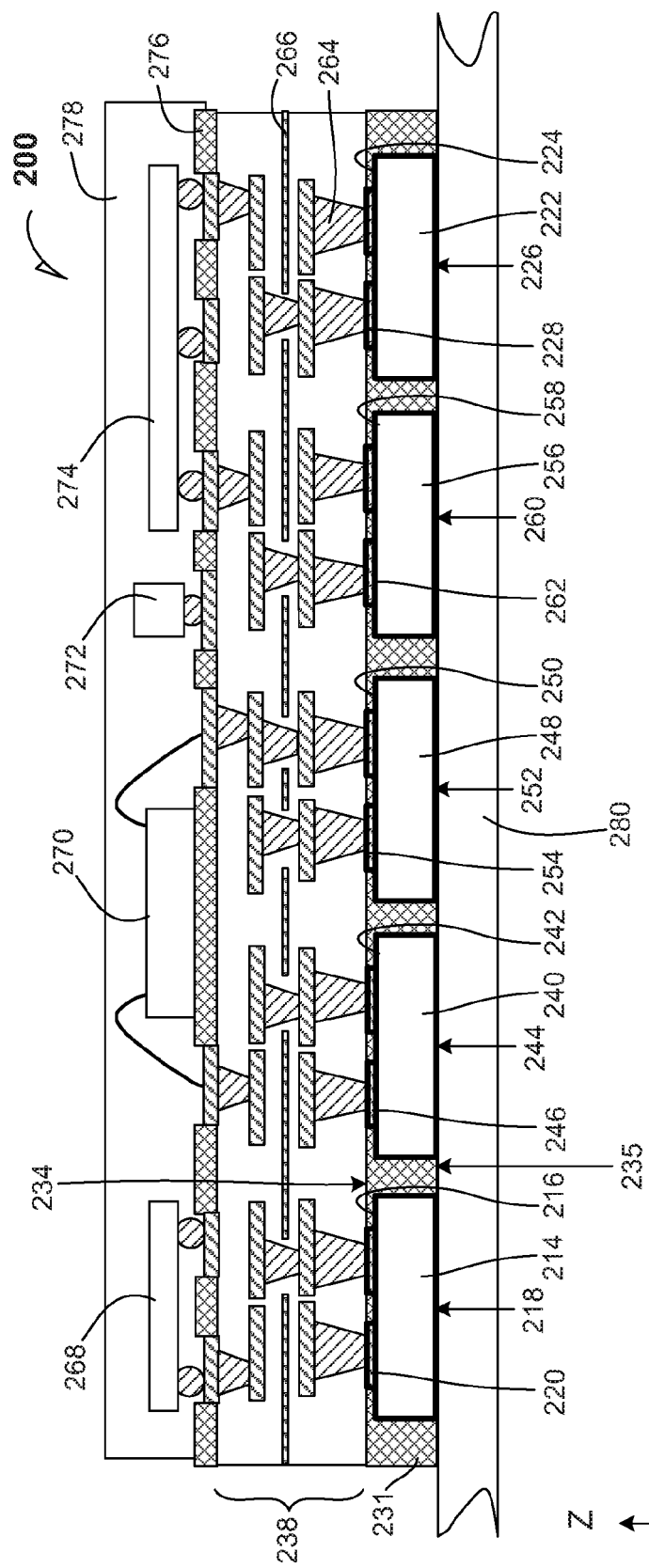
FIG. 2 is a cross-section elevation of a semiconductive device apparatus according to an example embodiment.

FIG. 2 is a cross-section elevation of a semiconductive device apparatus 200 according to an example embodiment. A rigid mass 231 holds a first die 214 with an active surface 216, a backside surface 218, and an electrical connection 220. The rigid mass 231 also holds a subsequent die 222 with an active surface 224, a backside surface 226, and an electrical connection 228. The rigid mass 231 also exhibits a substantially flat exposed surface 234 and a rigid mass base surface 235.

In an embodiment, the rigid mass 231 encapsulates a plurality of dice beyond the first die 214 and the subsequent die 222. As illustrated, additional dice are embedded in the rigid mass 231 including a second die 240 with an active surface 242, a backside surface 244, and an electrical connection 246, a third die 248 with an active surface 250, a backside surface 252, and an electrical connection 254, and a fourth die 256 with an active surface 258, a backside surface 260, and an electrical connection 262. In all as illustrated, there are five dice embedded in the rigid mass 231.

A BBUL structure 238 has been fabricated above the plurality of dice, and it is illustrated in simplified form. Metallizations 264 communicate between the plurality of dice embedded in the rigid mass 231 and the device that are fabricated as a structure 238. The metallizations 264 are depicted in simplified form for illustrative purposes and they are fabricated in several interlayer dielectric layers, which are also illustrated in simplified form. It can be seen that the metallizations 264 and the embedded dice 214, 240, 248, 256, and 222 are part of a package where the plurality of dice share at least a flat surface 234 with the rigid mass 231, and optionally the base surface 235 with their respective backside surfaces.

In the illustrated embodiment, flip-chip pads and wire-bond pads are configured as an extension of the BBUL structure 238. In an embodiment, an inter-layer metallization 266 is provided and it is illustrated in simplified form for clarity. The inter-layer metallization 266 is provided to act as a shielding structure to assist in sequestering local EM noise to areas that remain near the source of the noise. It may now be understood that shielding such as the inter-layer metallization 266 may be placed at several locations along the Z-direction to sequester EM noise that may be generated within the metallizations 264. In an embodiment, shielding may be achieved by partial placements along the X-direction according to specific needs. For example, the inter-layer metallization 266 may only traverse a portion of the X-direction.

The apparatus 200 also has at least one device disposed above the BBUL structure 238. In an embodiment, a first device 268 has been flip-chip mounted above the BBUL structure 238. In an embodiment, a second device 270 has been wire-bonded above the BBUL structure 238. In an embodiment, a third device 272 has been flip-chip mounted above the BBUL structure 238. In an embodiment, a subsequent device 274 has been flip-chip mounted above the BBUL structure 238. The several devices 268, 270, 272, and 274 are mounted through solder opens in a solder resist 276.

In an embodiment, the first device 268 is a flip-chip memory chip 268, the second device 270 is an RF wire-bond chip 270, the third device 272 is a passive device such as an inductor 272. In an embodiment, the third device 272 is a passive device such as a capacitor 272. In an embodiment, the third device 272 is a passive device such as a resistor 272. In an embodiment the third device 272 is an integrated passive device (IPD) such a band-pass filter 272. The band-pass filter 272 is coupled to the RF-wirebond chip 270 and is a supporting IPD to the RF-wirebond chip 270 according to an embodiment. In an embodiment, the band-pass filter 272 is located proximate the RF-wirebond chip 270. In an embodiment, "proximate" means there is no device disposed between (in the X-direction) the band-pass filter 272 and the RF-wirebond chip 270. In an embodiment, the IPD 272 is a low-pass filter. In an embodiment, the IPD 272 is a high pass filter. In an embodiment, the IPD 272 is a diplexer. In an embodiment, the IPD 272 is a balun. It may be understood these devices are connected to an RF device to perform certain RF support functions.

The apparatus 200 illustrates the several devices also has an overmold layer 278 that protects the at least one device mounted above the BBUL structure 238. The overmold layer 278 delivers multiple effects including at least protection of the at least one device mounted above the BBUL structure 238 and providing additional stiffness to the entire apparatus 200.

In an embodiment, the apparatus 200 has also been assembled to a substrate 280 such as a board for a smart phone or a hand-held electronic device. The substrate 280 may be referred to as a foundation substrate 280. In an embodiment, at least part of the substrate 280 is a heat sink that abuts the backside surface of at least one of the embedded dice.

The apparatus 200 illustrated provides a HDI design that results in a system-in-package (SiP) embodiment. Power and signal contacts may be formed either through the BBUL structure 238 or through the base surface 235 of the rigid mass 231. In an example embodiment, the apparatus 200 is a smart phone 200 with most of the processing power assigned to the embedded dice 214, 240, 248, 256, and 222. Where the memory caching function may be assigned to the flip-chip 268, and most of the RF duty assigned to the wire-bond chip 270, the third device 272 may be an inductor. The several embedded dice 214, 240, 248, 256, and 222 may all be identical such as a multi-core SiP according to an embodiment.

In an embodiment, each of the several embedded dice 214, 240, 248, 256, and 222 may be different from any other of the several embedded dice. It may now be appreciated that a large variety of embedded dice may be fabricated according to a given application need. It may now also be appreciated that the number of dice embedded in the terminal-exposing rigid mass 231 may be two, three, four, five, and more. In an embodiment, the number of embedded dice is eight.

Figure 3:
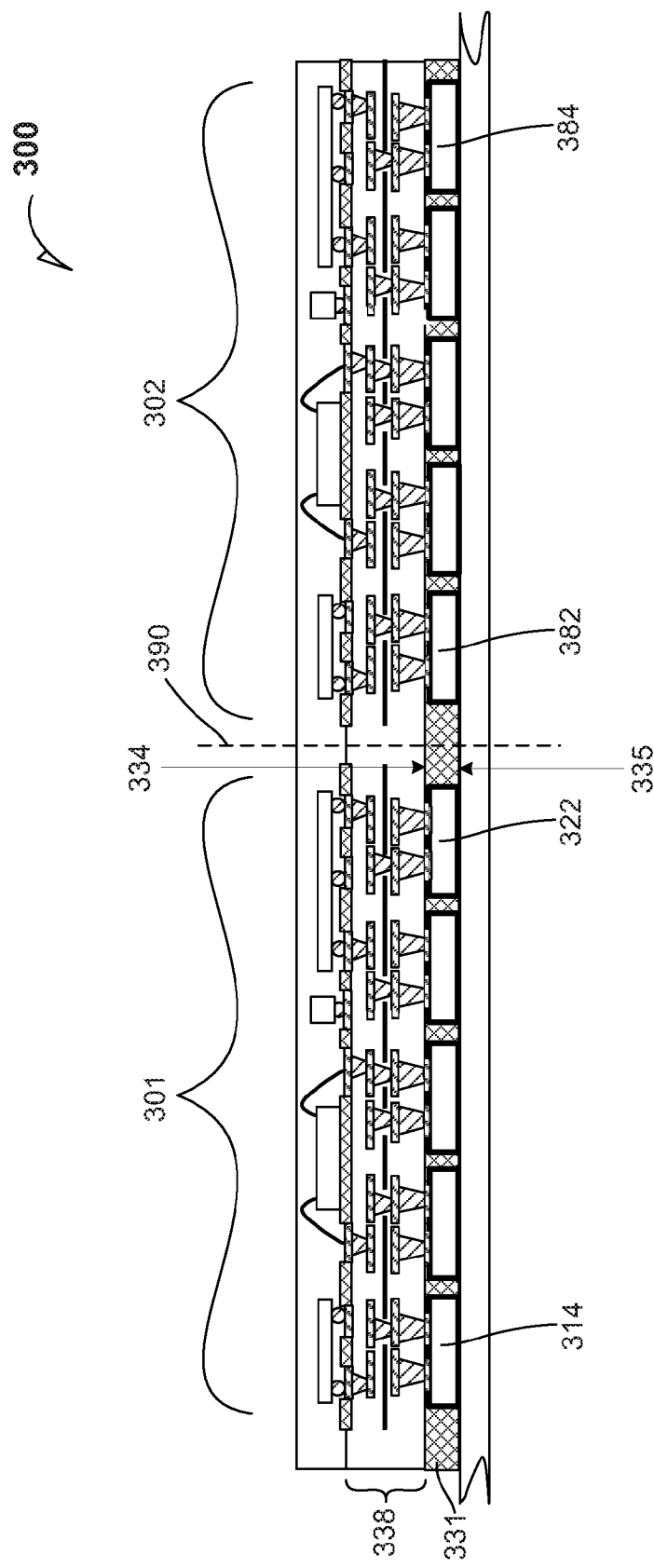
FIG. 3 is a cross-section elevation of a plurality of reconstituted wafers during processing according to an example embodiment.

FIG. 3 is a cross-section elevation of a reconstituted wafer 300 during processing according to an example embodiment. A plurality of embedded dice are found in the reconstituted wafer 300 may also be referred to as an unseparated apparatus array 300. The reconstituted wafer 300 may also be referred to as an array of embedded-dice devices 300. In an embodiment, the reconstituted wafer 300 is formulated with embedded dice numbering between 2 and 5,000. In an embodiment, the reconstituted wafer 300 is formulated with embedded dice numbering between 200 and 2,000. In an embodiment, the reconstituted wafer 300 is formulated with embedded dice numbering between 400 and 800.

An embedded-dice first apparatus 301 and an embedded-dice second apparatus 302 are depicted after processing to form substantially similar apparatus 301 and 302, but before they are divided from the reconstituted wafer 300. A terminal-exposing rigid mass 331 has been processed according to any disclosed embodiments such that the several dice are affixed in the rigid mass 331, but their respective terminals have been exposed for further processing as well as their backside surfaces have been exposed. The rigid mass 331 also exhibits a substantially flat exposed surface 334 and a rigid mass base surface 335.

The embedded-dice first apparatus 301 includes a plurality of dice that have been embedded in the terminal-exposing rigid mass 331. The plurality of dice disposed in the terminal-exposing rigid mass 331 include at least a first die 314 and a subsequent die 322. As illustrated, the embedded-dice first apparatus 301 has a total of five dice that are disposed in the terminal-exposing rigid mass 331 according to an embodiment. A scribe line 390 divides the embedded-dice first apparatus 301 and the embedded-dice second apparatus 302. Similarly, the embedded-dice second apparatus 302 includes a plurality of dice that have been embedded in the terminal-exposing rigid mass 331. For the embedded-dice second apparatus 302, the plurality of dice disposed in the terminal-exposing rigid mass 331 include at least a first die 382 and a subsequent die 384. As illustrated, the embedded-dice second apparatus 302 has a total of five dice that are disposed in the terminal-exposing rigid mass 331 according to an embodiment.

Further devices are depicted being disposed above a BBUL structure 338 such that after separating the two apparatus 301 and 302 along the scribe line 390 a plurality of embedded-dice apparatus derived from a single reconstituted wafer is achieved. It may now be appreciated that several similar apparatus may be manufactured in an array taken from a reconstituted wafer before separating into individual apparatus that may be individual SiPs. It may now also be appreciated that separating a reconstituted wafer may be done before the reconstituted wafer has been processed to the level of build depicted in FIG. 3. Further, it may now also be appreciated that separating may be done after even further processing has been done to the level of build depicted in FIG. 3.

FIG. 4 is a cross-section elevation of a plurality of reconstituted and joined apparatus 400 during processing according to an example embodiment. The plurality of reconstituted and joined apparatus 400 may also be referred to as a joined apparatus 400. A reconstituted first apparatus 401 and a reconstituted second apparatus 402 are depicted after processing to form substantially similar apparatus 401 and 402. A joinder line 492 delineates the joint formed by the reconstituted first apparatus and the reconstituted second apparatus 420.

With respect to the reconstituted first apparatus 401, a terminal-exposing rigid mass 431 has been processed according to any disclosed embodiments and the several dice are affixed in the rigid mass 331, but their respective terminals have been exposed for further processing. The reconstituted first apparatus 401 also exhibits a substantially flat exposed surface 434 and a rigid mass base surface 435.

The reconstituted first apparatus 401 includes a plurality of dice that have been embedded in the terminal-exposing rigid mass 431. The plurality of dice disposed in the terminal-exposing rigid mass 431 include at least a first die 414 and a subsequent die 422. As illustrated, the reconstituted first apparatus 401 has a total of two dice that are disposed in the terminal-exposing rigid mass 431 but more may be disposed in the rigid mass 431.

With respect to the reconstituted second apparatus 402, a terminal-exposing rigid mass 432 has been processed according to any disclosed embodiments and the several dice are affixed in the rigid mass 432, but their respective terminals have been exposed for further processing. The reconstituted second apparatus 402 also exhibits the substantially flat exposed surface 434 and the rigid mass base surface 435.

Similarly, the reconstituted second apparatus 402 includes a plurality of dice that have been embedded in the terminal-exposing rigid mass 432. For the reconstituted second apparatus 402, the plurality of dice disposed in the terminal-exposing rigid mass 432 includes at least a first die 440 and a subsequent die 456. As illustrated, the reconstituted subsequent apparatus 402 has a total of two dice that are disposed in the terminal-exposing rigid mass 432 but more may be disposed in the rigid mass 432.

Further devices may be installed above a BBUL first structure 438 and a BBUL second structure 439 such that after joining the two rigid masses 431 and 432, a reconstituted-and-joined apparatus 400 is achieved. It may now be appreciated that the BBUL first- and BBUL second structures 438 and 439, respectively may be a single structure that is manufactured after joinder of the two terminal-exposing rigid masses 431 and 432.

FIG. 5a is a cross-section elevation of an apparatus 500 derived from a reconstituted wafer during processing according to an example embodiment. A backing plate 510 is provided with an adhesive 512 disposed thereupon. The reconstituted apparatus 500 includes a first die 514 with an active surface 516 and a backside surface 518 (see FIG. 5b). The first die 514 also has electrical connections 520 such as raised copper posts. The apparatus 500 derived from a reconstituted wafer also includes a subsequent die 522 with an active surface 524 and a backside surface 526. The subsequent die 522 also has electrical connections 528 such as raised copper posts. In an embodiment, the first die 514 and the subsequent die 522 are substantially identical in form factor although it may have identical or different function.

With respect to the first die 514, the terminals 520 are raised above the active surface 516 in a range from zero (flush therewith) to 100 micrometer (μm). In an embodiment, the terminals 520 are raised above the active surface 518 in a range from 0.5 μm to 40 μm. Similarly where the first die 514 and the subsequent die 522 have virtually identical form factors in the Z-direction, the terminals 528 are raised above the active surface 524 in a range from zero (flush therewith) to 100 micrometer (μm). In an embodiment, the terminals 528 are raised above the active surface 124 in a range from 0.5 µm to 40 µm. The first die 514 and the subsequent die 522 are mounted with active surfaces facing upward (Z direction) and are configured such that the raised posts (e.g. electrical connections 520 and 528) have about the same Z-height as depicted.

In an embodiment, a second die 540 has an active surface 542, a backside surface 542, and electrical connections 544 such as copper posts. The second die has a shorter Z-direction form factor than the first die 514 and the subsequent die 522, but the electrical connections 546 are taller for the second die 540 such that they are flush with a substantially flat exposed surface 534, for which the first terminals 520 and subsequent terminals 528 are also flush therewith.

In an embodiment, a third die 556 has an active surface 558, a backside surface 560, and electrical connections 562 such as copper posts. The third die has a shorter Z-direction form factor than the first die 514 and the subsequent die 522, but it is disposed upon a jig 557 such that the electrical connections 562 are flush with the substantially flat exposed surface 534, for which the first terminals 520 and subsequent terminals 528 are also flush therewith. The semiconductor device 500 is being processed such that a rigid mass 530 is being height-reduced to expose terminals for the first die 514, the subsequent die 522, the second die 540, and the third die 556. In an embodiment, height reduction and exposing the terminals is accomplished with a grinding wheel 532. In an embodiment, height reduction and exposing the terminals is accomplished with a polishing pad 536.

FIG. 5b is a cross-section elevation of the semiconductor device depicted in FIG. 5a after further processing according to an embodiment. The semiconductor device 501 is depicted after processing that removes some of the rigid mass 530. The semiconductor device 501 has been processed to remove the backing plate 510 (seen in FIG. 5a) and the adhesive 512.

Figure 6:
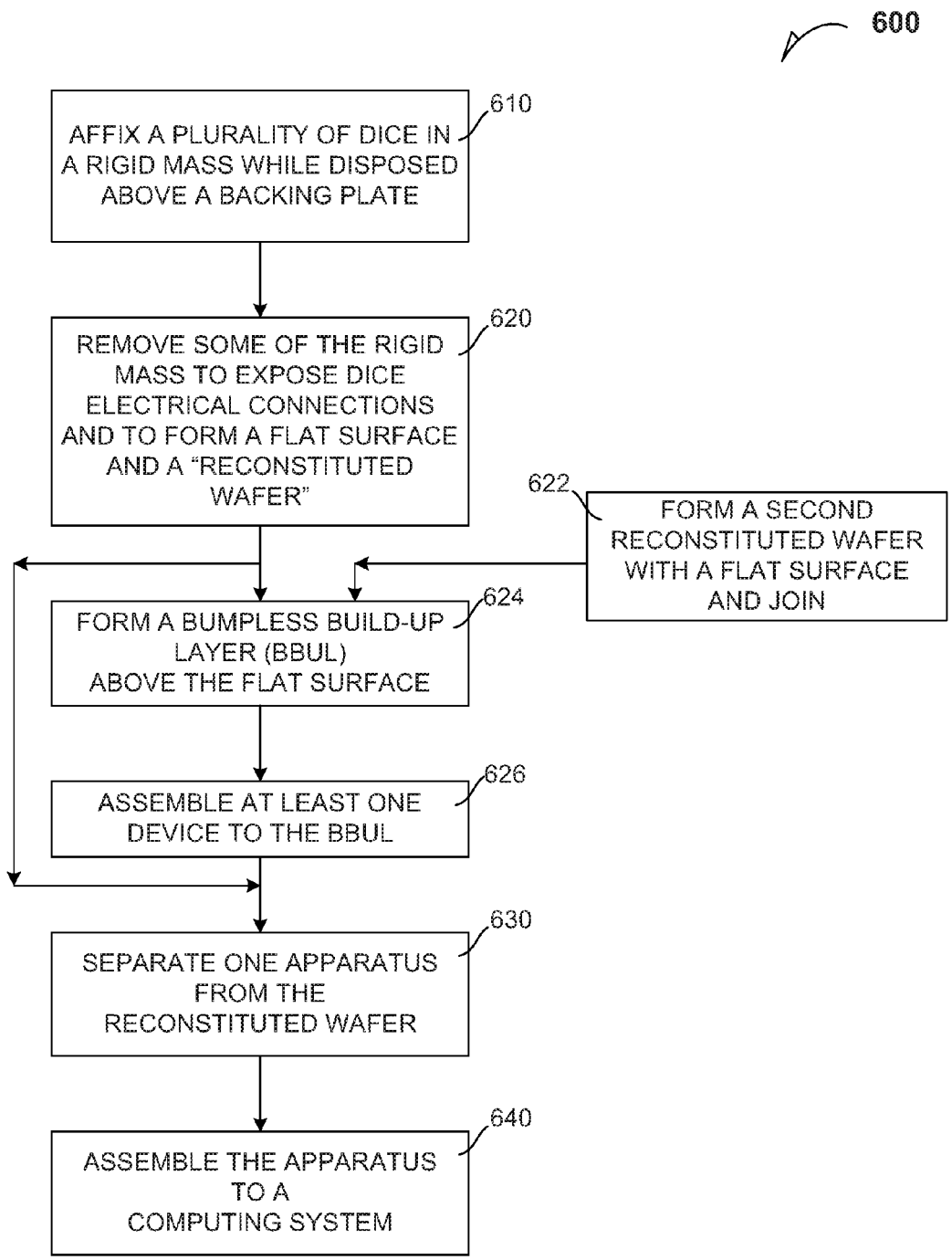
FIG. 6 is a process and method flow diagram according to an example embodiment.

After the flat exposed surface 534 has been formed, BBUL processing may be done to form a BBUL structure similar to any embodiments set forth in this disclosure FIG. 6 is a process and method flow diagram 600 according to several embodiments.

At 610, the process includes affixing a plurality of dice in a rigid mass while the dice are disposed above a backing plate. In a non-limiting example embodiment, the first die 114 and the subsequent die 122 are affixed upon the adhesive 112 above the backing plate 110.

At 620, the process includes removing some of the rigid mass to expose dice electrical connections and to form a flat surface and a reconstituted wafer. In a non-limiting example embodiment, the grinding wheel 132 is used to form a terminal-exposing rigid mass 131 from the rigid mass 130. In a non-limiting example embodiment, the polishing pad 136 is used to form the terminal-exposing rigid mass 131. In an embodiment, the process commences at 610 and terminates at 620. In an embodiment, removal of the backing plate may be done at 620.

At 622, a method embodiment includes forming a second reconstructed wafer with a flat surface and joining it to the one reconstituted wafer. This process may be joined before 624, and it may be joined at 630.

At 624, the process includes forming a bumpless build-up layer above the flat surface. In a non-limiting example embodiment, the BBUL 138 is formed above the flat surface 134. In an embodiment, removal of the backing plate may be done at 624. In an embodiment, the process commences at 610 and terminates at 624.

At 626, the process includes assembling at least one device to the bumpless build-up layer. In a non-limiting example embodiment, the first device 268 is flip-chip mounted above the BBUL structure 238.

At 630, the process includes separating one apparatus from the reconstituted wafer. In a non-limiting example embodiment, the first apparatus 301 and the second apparatus 302 are cut apart by a sawing technique. In an embodiment, removal of the backing plate may be done at 630. In an embodiment, separating one apparatus from the reconstituted wafer is done without any BBUL processing. In an embodiment, the process commences at 610 and terminates at 630.

At 640, a method embodiment includes assembling the apparatus to a computing system. Examples of this method embodiment are set forth below. In an embodiment, the process commences at 610 and terminates at 640.

Figure 7:
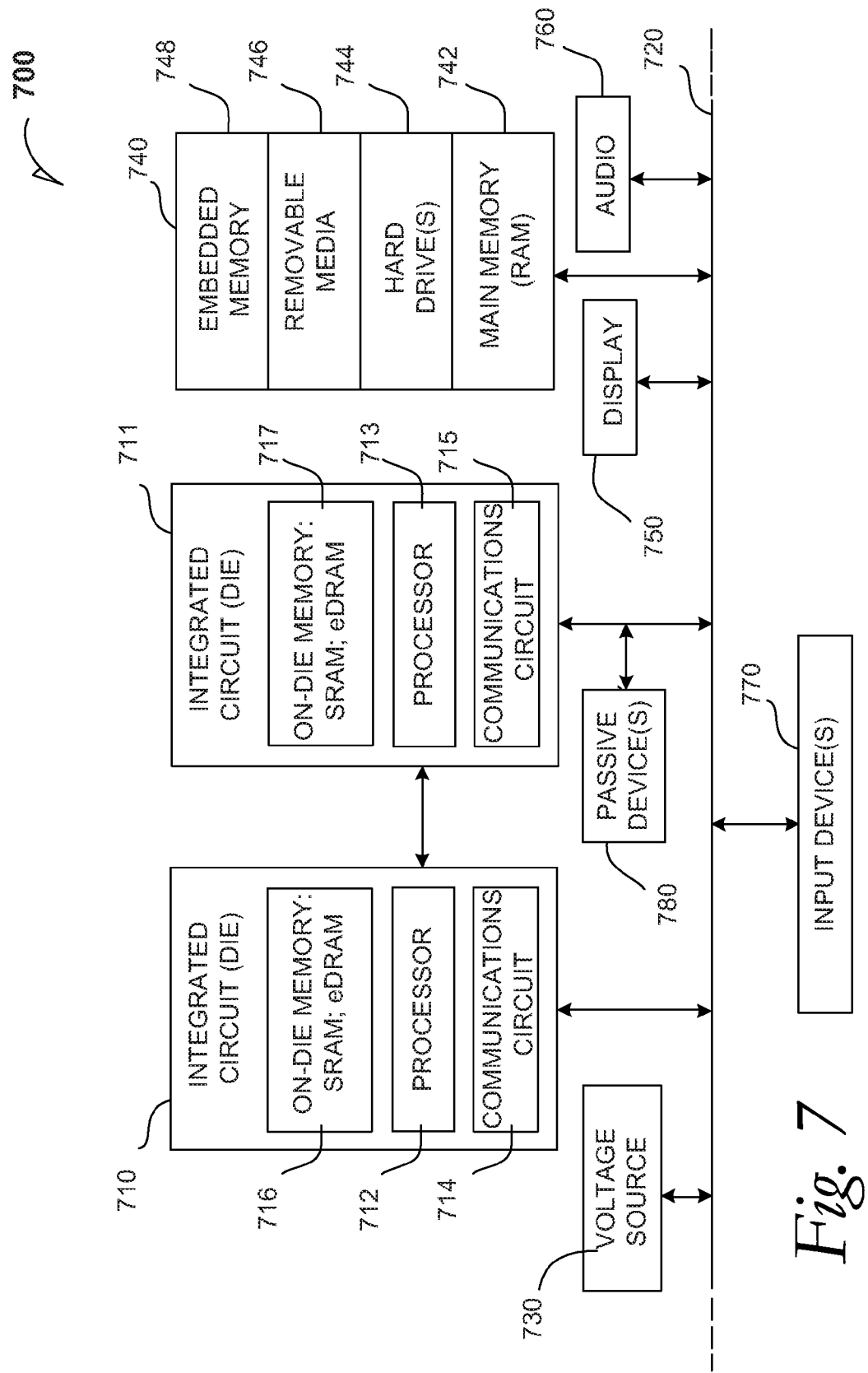
FIG. 7 is a schematic of a computer system according to an embodiment.

FIG. 7 is a schematic of a computer system 700 according to an embodiment. The computer system 700 (also referred to as the electronic system 700) as depicted can embody an apparatus derived from a reconstituted wafer according to any of the several disclosed embodiments and their equivalents as set forth in this disclosure. The computer system 700 may be a mobile device such as a netbook computer. The computer system 700 may be a mobile device such as a wireless smart phone. In an embodiment, the computer system 700 uses a reconstituted wafer apparatus as a signal-generating device where the apparatus derived from a reconstituted wafer contains the sources of signal generation.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 is in the apparatus derived from a reconstituted wafer disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems. In an embodiment, the processor 710 includes on-die memory 716 such as static random-access memory (SRAM). In an embodiment, the processor 710 includes embedded on-die memory 716 such as embedded dynamic random-access memory (eDRAM).

In an embodiment, the integrated circuit 710 is complemented with a subsequent integrated circuit 711 such as die in the reconstituted wafer apparatus embodiment. The dual integrated circuit 711 may includes a dual processor 713 and a dual communications circuit 715 and dual on-die memory 717 such as SRAM. In an embodiment, the dual integrated circuit 711 includes embedded on-die memory 717 such as eDRAM. In a embodiment, the dual integrated circuit 711 is an embedded subsequent die such as the subsequent die 122 depicted in FIG. 1f. In an embodiment where the dual integrated circuit 711 is an RF circuit such as the second device 270 which is wire-bonded above the BBUL structure 238 depicted in FIG. 2, a passive device 780 is also provided to assist in RF operation of the dual integrated circuit 711.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as an apparatus derived from a reconstituted wafer according to an embodiment.

In an embodiment, the electronic system 700 also includes a display device 750, and an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 as well as the subsequent integrated circuit 711 can be implemented in a number of different embodiments, including an apparatus derived from a reconstituted wafer according to any of the several disclosed embodiments and their equivalents, an electronic system, a computer system, one or more methods of fabricating an integrated circuit, and one or more methods of fabricating an electronic assembly that an apparatus derived from a reconstituted wafer according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration an apparatus derived from a reconstituted wafer according to any of the several disclosed apparatus derived from a reconstituted wafer embodiments and their equivalents.

Although a die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a reconstituted wafer, comprising:
   disposing a plurality of semiconductive dice above a backing plate, wherein the plurality of semiconductive dice includes a first die and wherein the first die includes at least one terminal on an active surface of the first die;
   embedding the plurality of semiconductive dice in a mass, wherein the mass obscures the at least one terminal of the first die, and wherein portions of the mass extend over and contact portions of the first die active surface; and
   removing a portion of the mass to expose the at least one terminal of the first die and to form a first surface; and
   removing the backing plate.

2. The process of claim 1, further comprising disposing an adhesive on the backing plate prior to disposing the plurality of semiconductive dice above the backing plate, and further comprising removing the adhesive after removing the portion of the mass.

3. The process of claim 1, wherein removing a portion of the mass comprises grinding the mass.

4. The process of claim 1, wherein removing a portion of the mass comprises polishing the mass.

5. The process of claim 1, wherein removing a portion of the mass comprises grinding followed by polishing.

6. The process of claim 1, further including cutting at least one of the plurality of semiconductive dice from the plurality of semiconductive dice after removing the backing plate.

7. The process of claim 1, further including forming metallizations above the first surface to connect to the at least one terminal of the first die.

8. The process of claim 1, further including forming a bumpless build-up layer (BBUL) above the first surface.

9. The process of claim 1, further including forming a bumpless build-up layer (BBUL) above the first surface prior to removing the backing plate.

10. The process of claim 9, further including cutting at least one of the plurality of semiconductive dice from the plurality of semiconductive dice after removing the backing plate.

11. The process of claim 1, further including forming a bumpless build-up layer (BBUL) above the first surface; and coupling a device to the BBUL and to at least one of the plurality of semiconductive dice, wherein the BBUL is between the device and the plurality of semiconductive dice.

12. The process of claim 1, further including forming a bumpless build-up layer (BBUL) above the first surface; and coupling a plurality of devices to the BBUL and to at least one of the plurality semiconductive dice, wherein the BBUL is between the plurality of devices and the plurality of semiconductive die, and wherein at least one device of the plurality of devices is a passive device.

13. The process of claim 1, further wherein embedding the plurality of semiconductive dice in a mass comprises embedding the plurality of semiconductive dice in an epoxy.

14. The process of claim 1, further wherein embedding the plurality of semiconductive dice in a mass comprises embedding the plurality of semiconductive dice in a material selected from the group consisting of silicones, polyimides, epoxy-acrylates, and liquid crystal polymers.

\* \* \* \* \*